United States Patent [19]

Lloyd et al.

[11] 3,855,009

[45] Dec. 17, 1974

[54] ION-IMPLANTATION AND CONVENTIONAL EPITAXY TO PRODUCE DIELECTRICALLY ISOLATED SILICON LAYERS

[75] Inventors: William W. Lloyd; Richard J. Dexter, both of Richardson, Tex.

[73] Assignee: Texas Instruments Incorporated, Dallas, Tex.

[22] Filed: Sept. 20, 1973

[21] Appl. No.: 399,034

[52] U.S. Cl. .................... 148/1.5, 148/175, 357/49, 357/91

[51] Int. Cl. .............................................. H01l 7/54

[58] Field of Search ............ 148/1.5, 175; 317/234, 317/235

[56] References Cited

UNITED STATES PATENTS

| | | | |
|---|---|---|---|
| 3,457,632 | 7/1969 | Dolan, Jr. et al. | 148/1.5 X |
| 3,666,548 | 5/1972 | Brack et al. | 148/1.5 X |
| 3,707,765 | 1/1973 | Coleman | 148/1.5 X |
| 3,721,588 | 3/1973 | Hays | 148/175 |
| 3,726,719 | 4/1973 | Brack et al. | 148/1.5 |
| 3,756,862 | 9/1973 | Ahn et al. | 148/175 X |

*Primary Examiner*—L. Dewayne Rutledge
*Assistant Examiner*—J. M. Davis
*Attorney, Agent, or Firm*—Harold Levine; James T. Comfort; Gary C. Honeycutt

[57] ABSTRACT

The disclosure relates to the formation of epitaxial silicon layers on insulating material. Buried layers of silicon nitride, oxide or carbide, approximately 4000 A in width, are formed by ion implantation while retaining a relatively undamaged layer of silicon near the surface. Epitaxial silicon of about 2$\mu$m thickness, for example, is grown on these surfaces and yields layers with significantly lower defect concentrations than for silicon layers on prior art substrates such as spinel.

18 Claims, 2 Drawing Figures

Figure 1:
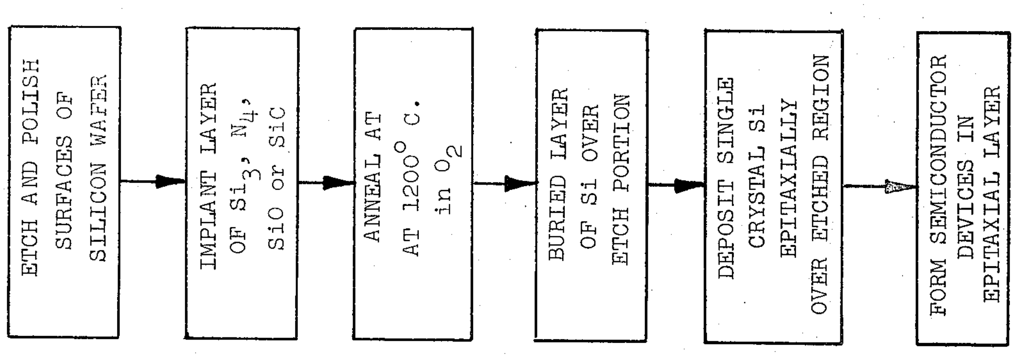

ION-IMPLANTATION AND CONVENTIONAL EPITAXY TO PRODUCE DIELECTRICALLY ISOLATED SILICON LAYERS

This invention relates to dielectric isolation by ion implantation, and, more specifically, to dielectric isolation of semiconductor devices by ion implantation into a good quality single crystal silicon slice with subsequent conventional epitaxial methods to provide the semiconductor devices.

The fabrication of monolithic integrated circuits requires that the active and passive elements of the circuit formed on the same semiconductor chip be internally isolated from each other to prevent unwanted electrical interaction. Normally this is accomplished by junction or dielectric isolation techniques.

In the formation of a plurality of semiconductor devices in a single crystal of semiconductor material, dielectric isolation between components is necessary to eliminate or reduce spurious electrical couplings between circuit components which are fabricated on the same semiconductor chip. Several prior art methods of dielectric isolation have been utilized by the prior art. One such existing technique is the use of an oxide mask followed by selective etching, epitaxial deposition, polycrystalline deposition and a precision lap and polish. A second technique is the growth of epitaxial single crystal silicon directly onto a dielectric, such as sapphire or spinel. The difficulty here is obtaining good quality single crystal silicon and avoiding the effects of mismatched crystal lattices. A third technique is the removal of the substrate from a silicon layer grown by regular techniques, the removal methods being by chemical or electro-chemical means. A fourth prior art technique as published by Schwuttke et al in JES 116, Nov. 11, 1969 involved high energy bombardment of a silicon slice with oxygen or nitrogen molecules. Subsequent annealing formed a buried layer of silicon dioxide or silicon nitride up to 2 microns deep. A limitation here is the high cost of a high energy machine while retaining the limitation of a relatively thin isolated layer.

A further and more conventional prior art technique involves the formation of p-n junctions between the circuit components. While this method has found wide popularity and provides good results, there is still coupling through the p-n junction, mainly due to the large area for current travel in the collector region across the junction. In addition, p-n junction isolation is severely weakened if exposed to a radiation ambient.

In accordance with the present invention, there is provided a method of dielectric isolation by ion implantation and subsequent conventional epitaxy wherein semiconductor components can be formed on a single crystal and spurious electrical coupling between the circuit components can be reduced to a minimum relative to prior art systems. This method has the advantage of normal dielectric isolation but can be produced from bulk silicon at low cost. Briefly, in accordance with the present invention, a silicon slice is bombarded with ions of either oxygen, nitrogen or carbon which are implanted to a depth of about 0.4 micrometers to form an insulating layer of silicon oxide, silicon carbide or silicon nitride, as the case may be of up to 3000 A on each side of the 0.4 micrometer depth. The silicon remaining over the buried layer is of reasonably high quality single crystal silicon at the surface, the quality increasingly improving from the buried layer toward the surface. An epitaxial layer of silicon is then deposited over the thin silicon layer, the epitaxial layer being of good quality single crystal silicon due to the high quality of the surface of the silicon region above the buried layer of dielectric. Semiconductor devices are then formed in the epitaxial layer in conventional manner to provide either pnp or npn devices. Due to the buried layer of dielectric, the silicon layer is dielectrically isolated from the rest of the silicon substrate and, therefore, the area along which spurious electrical coupling takes place is substantially minimized and can only take place above the buried layer. Accordingly, the semiconductor components are dielectrically insulated and isolated from each other. This dielectric insulation can be even more pronounced by forming a p-n junction between adjacent semiconductor components on the chip.

It is therefore an object of this invention to provide a semiconductor substrate having epitaxially grown single crystal silicon located over a buried layer of silicon oxide, carbide or nitride formed in a starting chip of single crystal silicon.

It is a further object of this invention to provide dielectric isolation in a monolithic integrated circuit by burying a layer of silicon oxide, nitride or carbide in a single crystal silicon chip and then growing a layer of single crystal silicon over the buried layer by conventional epitaxy.

Figure 2:
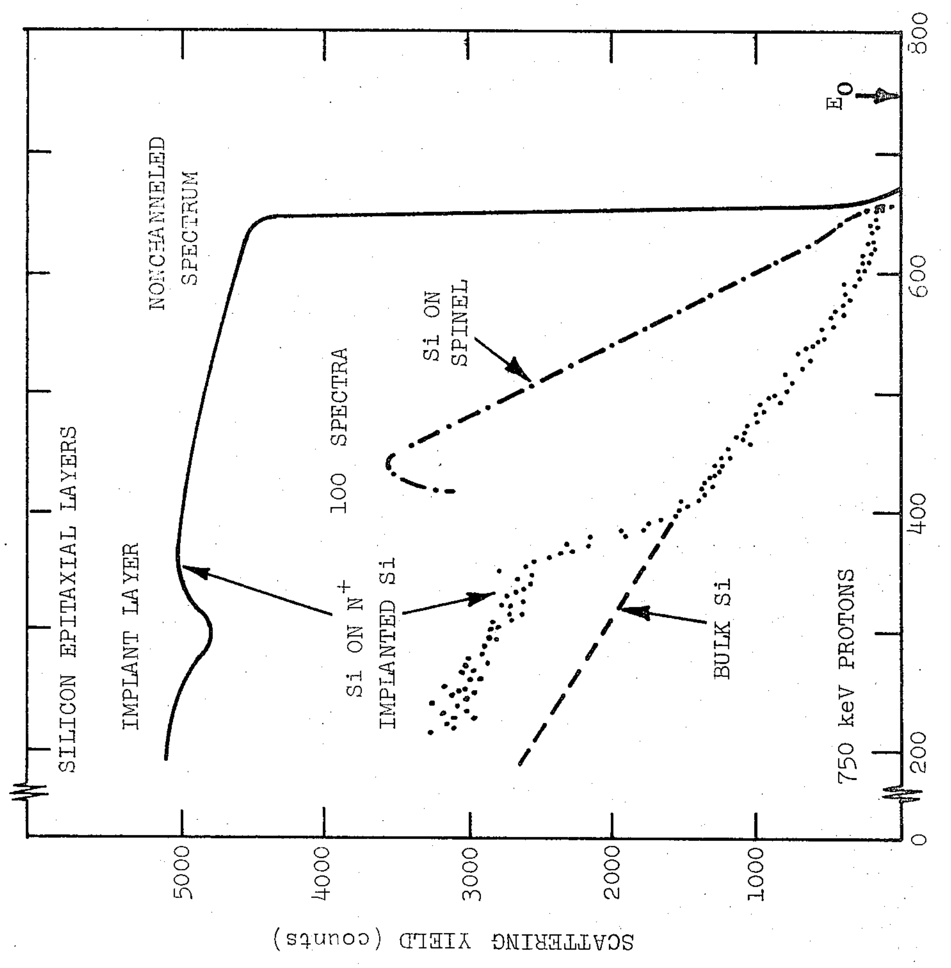

The above objects and still further objects of the invention will immediately become apparent to those skilled in the art after consideration of the following preferred embodiments thereof, which are provided by way of example and not by way of limitation, wherein:

FIG. 1 is a diagram of the steps required to form an integrated circuit according to the present invention; and FIG. 2 is a graph of channeled <100> and nonchanneled backscattering spectra for 720 keV incident protons on epitaxial silicon with buried nitride layer shown by dots and solid line respectively and portions of a <100> spectra for heteroepitaxial silicon layer on a spinel substrate (dot-dashed line) and for bulk silicon (dashed line), all spectra being taken for 6 $\mu$C proton fluence.

Referring now to FIG. 1, there is shown a diagram of the steps required to form an integrated circuit according to the present invention. Initially, the surfaces of a semiconductor silicon wafer are etched and polished and then a layer of silicon nitride, silicon carbide or silicon oxide is implanted therein by ion bombardment with an ion accelerator which provides energy in the amount of about 150 keV, the depth of penetration of the ions depending upon the energy provided by the ion accelerator and by the number of ions of $N_2$, $O_2$ or C present. The ions preferably penetrate the silicon wafer to a depth of 0.4 micrometers, the layer of the implanted material extending about 3000 A on both sides thereof. The amount of $O_2$, $N_2$ and C used at 150 keV is from about $5 \times 10^{16}$ to $5 \times 10^{17}$ atoms/cm$^2$. The wafer is then annealed at 1000° C. to about 1200° C. in a dry nitrogen atmosphere for 1 to 6 hours and preferably at least 3 hours to anneal out damage above the implanted layer and form the silicon compound with the implanted ions. The surface above the buried layer is then cleaned and etched to leave about 0.1 micrometers of monocrystalline silicon above the buried layer.

Then the wafer is placed in an epitaxial reactor and single crystal silicon is epitaxially deposited over the 0.1 micrometer layer. Semiconductor devices are then formed in the epitaxial layer in known manner.

The formation of layers containing silicon nitride after nitrogen implantation, silicon carbide after carbon implantation and silicon oxide after oxygen implantation into single crystal silicon has been known. Typically, high fluences ($\approx 10^{17}$ ions/$cm^2$) and anneal temperatures of 1000° C. have been required for silicon nitride formation. However, relatively little is known about the electrical properties of these layers and they have not previously been combined with silicon epitaxy.

In the slowing down of 150 keV nitrogen ions incident on a silicon crystal the initial energy loss will be primarily due to electronic excitation processes. At greater depths, after the ions have lost more energy, the energy loss going into atomic collision processes increases while the electronic component decreases. Since radiation damage in silicon results from the atomic collisions, the defect density profile is peaked near the ion profile at the end of the ion path. Upon annealing, a compound is formed in the region of the nitrogen projected range. The resulting structure will then be a buried layer of silicon nitride with a thin surface layer of silicon. This thin silicon surface layer is of sufficiently high crystalline quality to be used as a substrate for the growth of epitaxial silicon.

As shown in FIG. 1, samples were prepared for implantation for n- and p-type 1–10 Ω-cm silicon wafers with etch polished surfaces. Nitrogen ions were produced in an RF ion source, accelerated to 150 keV and mass-energy analyzed by an E × B velocity filter. The $14_N$ beam was then raster scanned over the wafer area to assure uniform coverage. Implants were performed at room temperature 7° from the major axis normal to the surface (<100> or <111>) in a $10^{-7}$ torr vacuum. The sample chamber served as a Faraday cup to monitor the ion current and the total implant fluence. Fluences between $10^{16}$ and $5 \times 10^{17}$ N/$cm^2$ were used with typical beam currents $\approx 1$ $\mu A/cm^2$. Calculations of the N profile based on LSS theory predict a gaussian distribution with projected range $R_p$=0.40$\mu$m and range spread $\Delta R_p - 0.1$ $\mu$m for 150 keV $^{14}N$ incident on silicon. For a fluence of $10^{17}/cm^2$ the peak N concentration is $\approx 5 \times 10^{21}/cm^3$ with the concentration falling below $10^{20}/cm^3$ at depths less than 0.15$\mu$m and to less than $10^{18}/cm^3$ at the surface. In addition, sputtering during implantation would account for the removal of less than 100 A of the surface.

After implantation the samples were annealed at 1200° C in a dry $N_2$ atmosphere. The formation of silicon nitride was monitored by infrared absorption measurements. Before implantation a broad absorption band is observed between 700 and 900 $cm^{-1}$. This band shifts to higher wave numbers and sharpens into a complex absorption spectrum with increased annealing. The strongest absorption occurs in a band at 485 $cm^{-1}$ and the general features of the spectrum are similar to those observed for silicon nitride layers formed by low temperature *rf* plasma techniques. Since the absorption spectra observed after 3 and 6 hour anneals are the same, it is assumed that compound formation is complete after 3 hours. The smaller band near 485 $cm^{-1}$ is attributed to single photon absorption in regions of damaged/strained silicon adjacent to and in the nitride layer.

A planar silicon etch which does not attack silicon nitride is used to remove the silicon surface over part of the $10^{17}$ N/$cm^2$ implanted and annealed wafer. The buried nitride layer is exposed by the etching and the etched step height was determined to be 0.2 $\mu$m by diamond stylus (Tallystep) measurements. Ellipsometry measurements using a wavelength of 6328° A gave a nitride layer thickness of 0.41 m with an average refractive index of 2.05. This index of refraction is similar to that measured for amorphous silicon nitride deposited by conventional techniques and the center of the nitride layer corresponds to the projected range for 150 keV$^{14}$N in silicon. The nitride layer is much thicker, however, than expected from the $10^{17}$ N/$cm^2$ implant for normal nitride stochiometry and density. This suggests that the nitride layer may consist of a matrix of silicon nitride and silicon.

Isolation characteristics were studied for the $10^{17}$ N/$cm^2$ implanted layers by etching through the nitride layer to form 100 mil diameter mesas. Contacts were applied to the mesa and the backside of the substrate, and the I–V characteristics were measured. A maximum voltage of 30 V could be applied before breakdown through the nitride layer, indicating a breakdown field strength of $7 \times 10^5$ V/cm. This may be compared to typical field strengths of $10^6$ V/cm for thermally deposited silicon nitride layers. For implant fluences $<5 \times 10^{16}/cm^2$ the annealed nitride layers were unstable under applied voltage (<5 to 10V) and exhibited unacceptably high leakage currents.

Epitaxial silicon layers of both (100) and (111) orientation were grown on implanted substrates which were annealed for 3 hours at 1200° C. Although the silcon surface over the implanted layer was not removed, light HCl vapor etching preceeded growth of 2 to 6 $\mu$m silicon layers by silane epi. Prior to etching, interference photomicroscopy indicates a relatively smooth surface topology in areas other than those containing stacking faults. After the preferential etch, the stacking fault density was determined. No significant differences in stacking fault densities were observed for epitaxial layers between 1 and 6 $\mu$m thickness. The best layers obtained had fault densities $\approx 10^4/cm^2$, which is comparable to that obtained for bulk silicon when silicon removal by vapor etching before epitaxial growth is limited to less than 0.1 $\mu$m.

The epitaxial layer quality is strongly dependent on the thin silicon layer quality above the buried nitride layer. Polycrystalline epitaxial growth is obtained for 150 keV nitrogen implants if fluences $<5 \times 10^{17}/cm^2$ are used, or for $1 \times 10^{17}/cm^2$ fluences if implant energies are reduced to <100 keV. Additional evidence for the importance of the thin silicon surface layer is given by a control run where only one-half of a wafer was implanted. After a 1200° C anneal the wafer was given a vapor etch sufficient to reach the buried nitride layer prior to epitaxial growth. The result was polycrystalline silicon growth over the nitride layer and good epitaxial layer growth over the unimplanted region.

The crystalline quality of the "implanted-epi" layers for implants $\leq 1 \times 10^{17}$ N/$cm^2$ was compared to 2.2 $\mu$m heteroepitaxial silicon on spinel by proton channeling measurements. This technique has been used in the prior art to obtain depth profiles of the density of crystal imperfections in heteroepitaxial silicon. The channeled and non-channeled backscattering spectra for 720 keV incident protons are shown in FIG. 2 for a $1 \times 10^{17}N/cm^2$ (100) "implant-epi" layer. The dots are for a <100> channeling orientation and a solid line represents a smooth curve drawn through the data for a non-channeled orientation. Also shown for energies above 400 keV is the channeling spectrum for a 2.2$\mu$m (100) silicon layer on spinel. The scattering from silicon atoms at the surface corresponds to the high energy edge at 626 keV and scattering from increasingly greater depths corresponds to the yield at lower energies.

The increased yield for the silicon-on-spinel over that for the "implant-epi" silicon indicates a significantly greater density of imperfections throughout the layer in the heteroepitaxial layer. Recent heteroepitaxy of Si on sapphire has resulted in Si layers with significantly lower defect concentrations, however those examined still gave scattering yields above that for the "implant-epi" layers. The <100> scattering yield in the "implant-epi" layer is the same as that for bulk silicon for energies down to 400 keV, indicating the density of imperfections is below the threshold of sensitivity ($\approx 10^5/cm^2$) throughout the layer for these single alignment channel-measurements. Near 400 keV the yield rises rapidly as the channeled protons pass through the nitride layer and then levels out parallel to that for bulk silicon at lower energies corresponding to scattering in the single crystal silicon substrate beyond the nitride layer. The presence of the nitride layers is also reflected by the dip in a non-channeled spectrum due to the additional contribution to the proton stopping by nitrogen atoms. The lower energy position of the dip in the non-channeled spectrum compared to the position of the sharp rise in the <100> spectrum is due to the reduced proton stopping power during channeling. From the dip in the non-channeled spectrum the center of the nitride layer can be estimated to 2.9 $\mu$m deep, in this case, with a thickness of $\approx$0.2 $\mu$m. This approximate width for the high N concentration region is somewhat thinner than indicated by ellipsometry measurements and is consistent with the calculated nitrogen implant profile. The ellipsometry measurements suggest, however, that some microregions of silicon nitride extend beyond this high concentration region.

The combination of N implantations and epitaxial growth has been shown to be a new alternative method of dielectric isolation for silicon device fabrication. High quality layers require close control of the epi process due to the shallow depth of the buried nitride layer after implantation and annealing. Further improvements in the crystalline quality of epitaxial layers might be expected for higher energy nitrogen implants.

It should also be noted that though the preferred embodiment has been set forth with reference to $Si_3N_4$ as the buried layer, buried layers of SiC and SiO can also be used with appropriate changes in parameters.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of dielectrically isolating silicon layers which comprises the steps of:

a. providing a wafer of single crystal silicon, b. implanting ions taken from the class consisting of oxygen, nitrogen and carbon at a predetermined depth in said wafer, c. forming a layer of a compound of said implanted ions with the silicon of said wafer within said wafer, leaving single crystal silicon above said layer, and d. epitaxially depositing single crystal silicon over said layer.

2. A method of dielectrically isolating silicon layers as set forth in claim 1 wherein step (b) includes accelerating said ions with an energy of about 150 keV.

3. A method as set forth in claim 2 wherein the concentration of said ions is from about $5 \times 10^{16}$ to about $5 \times 10^{16}$ to about $5 \times 10^{17}$ atoms/cm$^2$.

4. A method as set forth in claim 1 wherein said wafer is etched to provide about a 0.1 micrometer layer of single crystal silicon prior to step (d).

5. A method as set forth in claim 2 wherein said wafer is etched to provide about 0.1 micrometer layers of single crystal silicon prior to step (d).

6. A method as set forth in claim 3 wherein said wafer is etched to provide about a 0.1 micrometer layer of single crystal silicon prior to step (d).

7. A method as set forth in claim 1 wherein step (d) includes annealing said wafer for from about 1 to 6 hours at a temperature of about 1000° to about 1200° C.

8. A method as set forth in claim 7 wherein said wafer is annealed for at least 3 hours at about 1200° C.

9. A method as set forth in claim 2 wherein step (c) includes annealing said wafer for from about 1 to 6 hours at a temperature of about 1000° to about 1200° C.

10. A method as set forth in claim 9 wherein said wafer is annealed for at least 3 hours at about 1200° C.

11. A method as set forth in claim 3 wherein step (c) includes annealing said wafer for from about 1 to 6 hours at a temperature of about 1000° to 1200° C.

12. A method as set forth in claim 11 wherein said wafer is annealed for at least 3 hours at about 1200° C.

13. A method as set forth in claim 4 wherein step (c) includes annealing said wafer for from about 1 to 6 hours at a temperature of about 1000° to 1200° C.

14. A method as set forth in claim 13 wherein said wafer is annealed for at least 3 hours at about 1200° C.

15. A method as set forth in claim 5 wherein step (c) includes annealing said wafer for from about 1 to 6 hours at a temperature of about 1000° to about 1200° C.

16. A method as set forth in claim 15 wherein said wafer is annealed for at least 3 hours at about 1200° C.

17. A method as set forth in claim 6 wherein step (c) includes annealing said wafer for from about 1 to 6 hours at a temperature of about 1000° to about 1200° C.

18. A method as set forth in claim 7 wherein said wafer is annealed for at least 3 hours at about 1200° C.

* * * * *